United States Patent
Noda et al.

(10) Patent No.: US 9,525,495 B2
(45) Date of Patent: Dec. 20, 2016

(54) BURST-MODE RECEIVER, AND METHOD OF BIAS VOLTAGE CONTROL FOR APD OF BURST-MODE RECEIVER

(71) Applicant: Mitsubishi Electric Corporation, Chiyoda-ku (JP)

(72) Inventors: Masaki Noda, Chiyoda-ku (JP); Susumu Ihara, Chiyoda-ku (JP); Satoshi Yoshima, Chiyoda-ku (JP); Masamichi Nogami, Chiyoda-ku (JP)

(73) Assignee: MITSUBISHI ELECTRIC CORPORATION, Chiyoda-ku (JP)

( * ) Notice: Subject to any disclaimer, the term of this patent is extended or adjusted under 35 U.S.C. 154(b) by 0 days.

(21) Appl. No.: 14/768,844

(22) PCT Filed: May 30, 2013

(86) PCT No.: PCT/JP2013/065037
§ 371 (c)(1),
(2) Date: Aug. 19, 2015

(87) PCT Pub. No.: WO2014/128986
PCT Pub. Date: Aug. 28, 2014

(65) Prior Publication Data
US 2016/0006517 A1      Jan. 7, 2016

(30) Foreign Application Priority Data

Feb. 19, 2013   (JP) .................. 2013-029901

(51) Int. Cl.
*H04B 10/69* (2013.01)
*H03F 17/00* (2006.01)
(Continued)

(52) U.S. Cl.
CPC ............. *H04B 10/6911* (2013.01); *H03F 3/08* (2013.01); *H03F 17/00* (2013.01);
(Continued)

(58) Field of Classification Search
CPC ...................... H04B 10/69–10/6973
See application file for complete search history.

(56) References Cited

U.S. PATENT DOCUMENTS

| 6,643,472 B1* | 11/2003 | Sakamoto | ............. H04B 10/66 250/214 R |
| 2003/0123168 A1* | 7/2003 | Yokomizo | .......... H04B 10/6931 359/896 |

(Continued)

FOREIGN PATENT DOCUMENTS

| JP | 6 224855 | 8/1994 |
| JP | 8 139526 | 5/1996 |

(Continued)

OTHER PUBLICATIONS

International Search Report Issued Aug. 6, 2013 in PCT/JP2013/065037 Filed May 30, 2013.

*Primary Examiner* — Nathan Curs
(74) *Attorney, Agent, or Firm* — Oblon, McClelland, Maier & Neustadt, L.L.P.

(57) ABSTRACT

A burst-mode receiver for receiving burst optical signals having different intensities by a reversely connected APD, including: a current detection circuit outputting a photocurrent that is generated by APD and is output from a current mirror circuit (CMC) as a voltage proportional to the photocurrent, the CMC being connected in series between a power supply and APD; a peak detector circuit detecting and holding a peak value of the output voltage of the current detection circuit; a resistor connection switching circuit, which is inserted between the CMC and APD, for connecting a series resistor to APD in series by switching; and a comparator outputting a switching signal for switching the resistor connection switching circuit so that the series resis- (Continued)

tor is connected to APD in series in a case where a voltage detected by the peak detector circuit is equal to or more than a predetermined threshold.

17 Claims, 7 Drawing Sheets

(51) Int. Cl.
  *H03F 3/08* (2006.01)
  *H04B 10/079* (2013.01)
  *H04Q 11/00* (2006.01)
(52) U.S. Cl.
  CPC ....... *H04B 10/0797* (2013.01); *H04B 10/691* (2013.01); *H04Q 11/0067* (2013.01); *H03F 2200/129* (2013.01); *H04Q 2011/0045* (2013.01); *H04Q 2011/0083* (2013.01)

(56) References Cited

U.S. PATENT DOCUMENTS

| | | | |
|---|---|---|---|
| 2005/0001150 A1* | 1/2005 | Yonemura | H04B 10/6911 250/214 R |
| 2006/0104647 A1* | 5/2006 | Schrodinger | H04B 10/693 398/202 |
| 2006/0157646 A1* | 7/2006 | Uchida | H04B 10/66 250/214 R |
| 2011/0129224 A1 | 6/2011 | Umeda | |

FOREIGN PATENT DOCUMENTS

| | | |
|---|---|---|
| JP | 2004 71982 | 3/2004 |
| JP | 2005 354548 | 12/2005 |
| JP | 2006 179981 | 7/2006 |
| JP | 2007 166096 | 6/2007 |
| JP | 2009 303159 | 12/2009 |

* cited by examiner

BURST-MODE RECEIVER, AND METHOD OF BIAS VOLTAGE CONTROL FOR APD OF BURST-MODE RECEIVER

TECHNICAL FIELD

The present invention relates to a burst-mode receiver serving as a receiver for an optical line terminal (OLT), which is used at a station (base station) of a passive optical network (PON) system that is one of optical communication systems, and more particularly, to a bias voltage control for an APD of a burst-mode receiver.

BACKGROUND ART

In a PON system that is one of optical communication systems, continuous signals are first transmitted from a station-side optical line terminal (station-side OLT) to a subscriber's home optical network unit (subscriber-side ONU) arranged in each of houses, and the continuous signals are then received by the ONU. Because the ONU transmits a time-division multiplexed signal (packet) to the OLT, a receiver for the OLT is required to have a burst receiving function of instantaneously electrically regenerating a packet signal. At this time, the ONUs are arranged on various locations when seen from the OLT, and hence the OLT is required to receive packets different in optical power.

Meanwhile, as an element for converting the optical signal (packet) into a current in the OLT receiver, an avalanche photodiode (APD) is used. Because the APD has a function of multiplying a photocurrent, when a multiplication factor M of the APD is set to be high and an input signal has low optical input power, high receiving sensitivity can be realized. On the other hand, when an input signal has high optical input power and the multiplication factor is set to be high, there is such a risk that an overcurrent may flow to break down the APD.

Thus, in the PON system described above, the OLT may receive strong optical input light from the ONU, which is close to the OLT, and hence it is desired that the multiplication factor M be changed depending on each of input packets. Because the OLT is required to perform the reception in burst (convert optical signals having different intensities into electrical signals having uniform intensity), the multiplication factor M is required to be changed at high speed of the order of nanosecond (ns).

In Patent Literature 1, there is disclosed a circuit as an example of a related-art burst-mode receiver in which the multiplication factor M is changed at high speed as described above. The related-art burst-mode receiver, which is described as a bias control circuit for an APD, includes an avalanche photodiode (APD) for converting an optical signal into a current, a preamplifier unit for converting the generated photocurrent into a voltage to amplify the voltage, a current mirror unit capable of outputting a current having substantially the same value as the photocurrent of the APD, a high voltage generating circuit, a control circuit of the high voltage generating circuit, and a circuit for changing an output voltage of the control circuit.

The APD converts input light into a photocurrent. Then, in response to a signal obtained by converting a collector current of a transistor into a voltage by a resistor, the collector current serving as an output of the current mirror that exhibits a current having substantially the same value as the photocurrent of the APD, the APD changes a voltage input to the control circuit from the circuit for changing an output voltage of the control circuit, and further changes an output voltage of the high voltage generating circuit. In this manner, a voltage applied to the APD is changed so as to follow the photocurrent (input optical power) flowing through the APD (see FIG. 7 described later).

CITATION LIST

Patent Literature

[PTL 1] JP 2007-166096 A

SUMMARY OF INVENTION

Technical Problems

The related-art bias voltage control method for an APD of a burst-mode receiver as described above involves changing the APD voltage every time a current flowing through the current mirror is changed, and hence a current input to the preamplifier is changed. Consequently, there is a problem in that it is difficult for an output of automatic gain control (AGC) of the preamplifier to be constant, which causes an error in a case where such a method is applied to a burst-mode receiver required to transmit and receive a short packet of about a few microseconds.

Moreover, an unstable output photocurrent causes another problem in that, in a case where an attempt is made to realize a monitoring function for optical input power required in 10 Gigabit Small Form Factor Pluggable (XFP) that is one of industry standards for a removable module of 10 Gigabit Ethernet (trademark) (10 GbE), a correct value cannot be monitored in a short period of time due to a variable photocurrent.

Moreover, in a case where the voltage control circuit changes the output voltage of the high voltage generating circuit, it is necessary to use a high speed response circuit. Consequently, there is still another problem in that, in an ordinary voltage generating circuit, a capacitor having a relatively large capacity used for suppressing voltage variation due to external noise cannot be used as a filter because the use of such a capacitor reduces the response speed.

The present invention has been made in order to solve the above-mentioned problems, and has an object to provide a burst-mode receiver and the like that are capable of, with a relatively simple circuit configuration, changing a voltage applied to an APD at high speed, and at the same time, maintaining a photocurrent of the APD to be stable when high optical output power is input to the APD.

Solution to Problem

According to one embodiment of the present invention, there are provided a burst-mode receiver and the like for receiving burst optical signals having different intensities by a reversely connected APD, the burst-mode receiver including: a current detection circuit for outputting a photocurrent that is generated by the reversely connected APD and is output from a current mirror circuit as a voltage proportional to the photocurrent, the current mirror circuit being connected in series between a power supply and the reversely connected APD; a peak detector circuit for detecting and holding a peak value of the output voltage of the current detection circuit; a resistor connection switching circuit, which is inserted between the current mirror circuit and the reversely connected APD, for connecting a series resistor to the reversely connected APD in series by switching; and a comparator for outputting a switching signal for switching the resistor connection switching circuit so that the series resistor is connected to the reversely connected APD in series in a case where a voltage detected by the peak detector circuit is equal to or more than a predetermined threshold.

Advantageous Effects of Invention

According to the one embodiment of the present invention, it is possible to provide the burst-mode receiver and the like that are capable of, with a relatively simple circuit configuration, changing a voltage applied to the APD at high speed, and at the same time, maintaining the photocurrent of the APD to be stable when high optical output power is input to the APD.

DESCRIPTION OF EMBODIMENT

Figure 6:
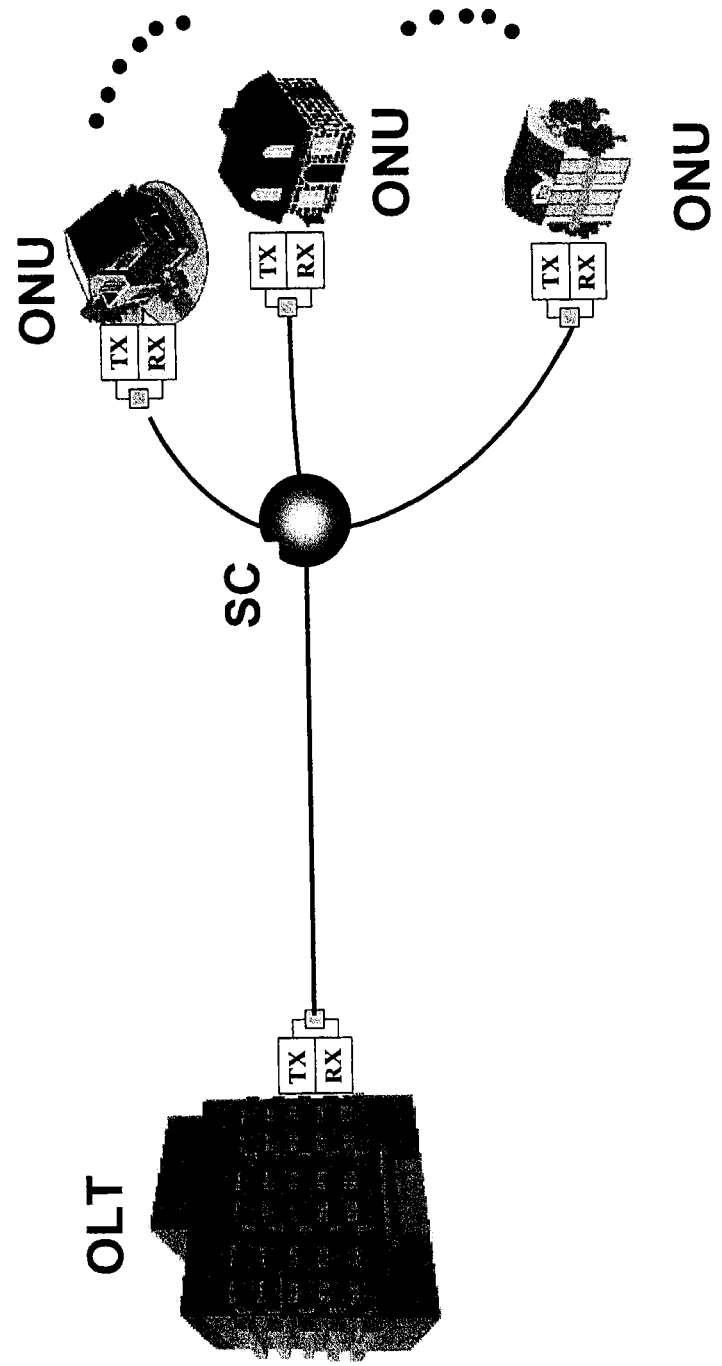
FIG. 6 is a schematic view of a PON system to which the burst-mode receiver according to the present invention is applied.

First, in a PON system to which a burst-mode receiver according to the present invention is applied, for example, as illustrated in FIG. 6, a plurality of subscriber-side optical network units (subscriber-side ONU) are connected to a station-side optical line terminal (station-side OLT) by optical cables via star couplers SC or the like. Each of the ONUs includes an optical transmitter TX and an optical receiver RX, and the OLT also includes the optical transmitter TX and the optical receiver RX. The present invention particularly relates to the optical receiver RX for the OLT referred to as a burst-mode receiver, which is required to have a burst receiving function of instantaneously electrically regenerating packet signals having different light intensities from the plurality of ONUs located at different distances.

Figure 7:
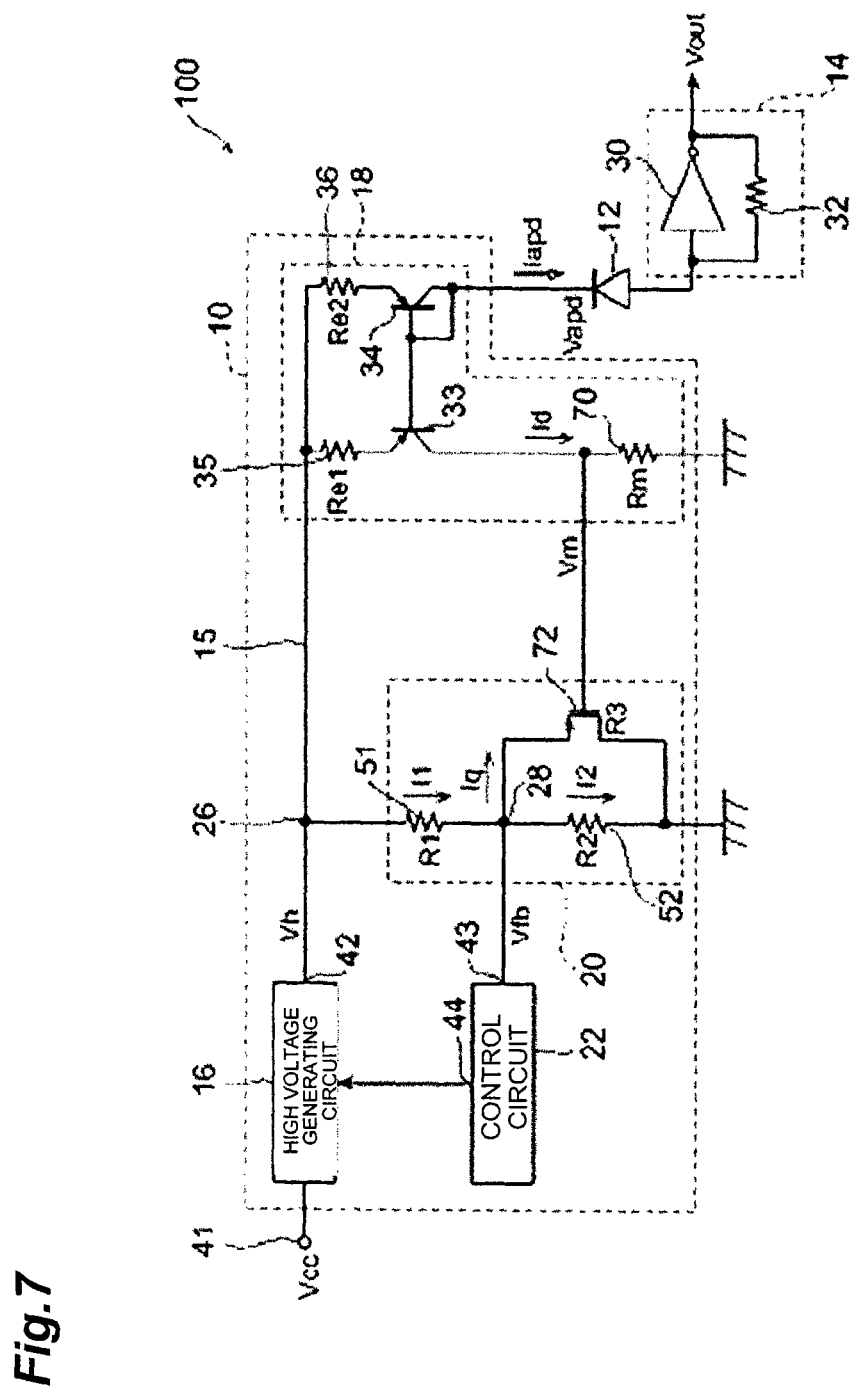
FIG. 7 is a diagram illustrating an example of a bias control circuit used in this type of related-art burst-mode receiver.

A bias control circuit used in this type of related-art burst-mode receiver, which is described above and is illustrated in FIG. 7, is now briefly described. The bias control circuit includes an avalanche photodiode (APD) (12) for converting an optical signal into a current, a preamplifier unit (14) for converting the generated photocurrent into a voltage to amplify the voltage, a current mirror unit (18) capable of outputting a current having substantially the same value as the photocurrent of the APD, a high voltage generating circuit (16), a control circuit (22) of the high voltage generating circuit, and a circuit (20) for changing an output voltage of the control circuit.

The APD (12) converts input light into a current, and a collector current of a transistor (33) serving as an output of the current mirror unit (18) flows through a resistor Rm (70). A resistance of a MOS transistor R3 (72) is changed depending on an output voltage of the resistor Rm (70), to thereby change a current path flowing from a node (26) to a resistor R2 (52). An input of the control circuit (22) is changed depending on a current flowing through a resistor R1 (51), and hence a current flowing through the MOS transistor R3 (72) is changed so that the input voltage of the control circuit (22) is changed and an output voltage of a high voltage generating circuit (42) is also changed. By taking such a method, a voltage applied to the APD (12) is changed so as to follow the photocurrent (input optical power) flowing through the APD (12).

In this case, however, as described above, there is a problem in that it is difficult for an output of automatic gain control (AGC) of the preamplifier to be constant, which causes an error in a case where such a method is applied to a burst-mode receiver for transmitting and receiving a short packet of about a few microseconds.

Now, a burst-mode receiver and the like according to each of embodiments of the present invention are described with reference to the drawings. Note that, in each of the embodiments, the same or corresponding portions are denoted by the same reference symbols, and the overlapping description thereof is omitted.

First Embodiment

Figure 1:
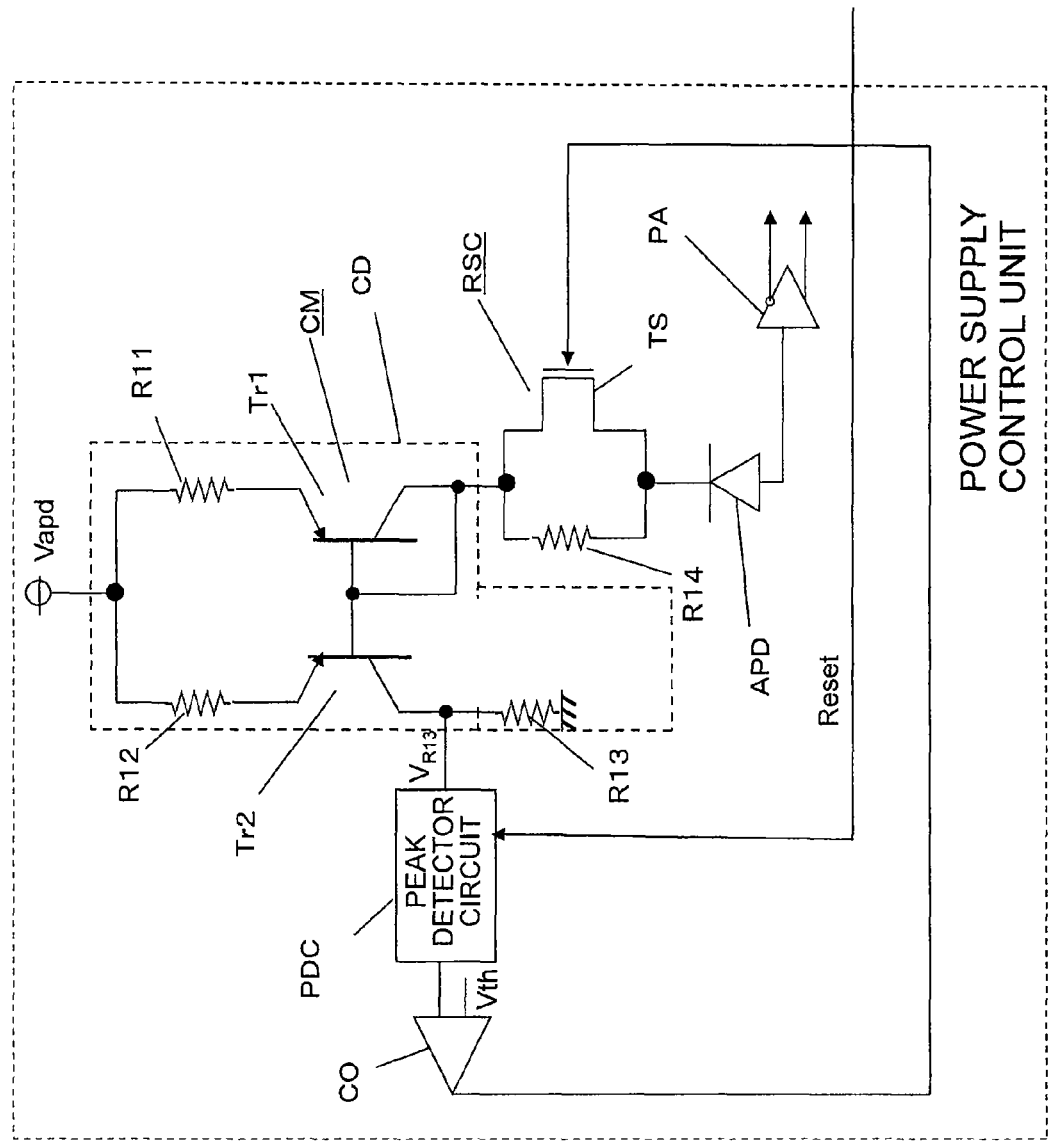
FIG. 1 is a diagram mainly illustrating a configuration of a power supply control unit of a burst-mode receiver according to an embodiment of the present invention.

FIG. 1 is a diagram mainly illustrating a configuration of a power supply control unit of a burst-mode receiver according to an embodiment of the present invention. The power supply control unit includes: a current detection circuit CD for outputting a photocurrent that is generated by an avalanche photodiode APD and is output from a current mirror circuit CM as a voltage proportional to the photocurrent, the current mirror circuit CM being connected in series between a power supply Vapd and the APD; a peak detector circuit PDC for detecting and holding a peak value of the output voltage of the current detection circuit CD; a resistor connection switching circuit RSC, which is inserted between the current mirror circuit CM and the avalanche photodiode APD, for connecting a series resistor R14 to the avalanche photodiode APD in series by switching; a comparator CO for outputting a switching signal for switching the resistor connection switching circuit RSC so that the series resistor R14 is connected to the avalanche photodiode APD in series in a case where a voltage detected by the peak detector circuit PDC is equal to or more than a predetermined threshold Vth; and a preamplifier PA for converting the photocurrent generated by the avalanche photodiode APD into a voltage to amplify the voltage.

More specifically, the current mirror circuit CM of the current detection circuit CD includes PNP transistors Tr1 and Tr2 and resistors R11 and R12 for determining an output of the current mirror. The transistors Tr1 and Tr2 include bases connected to each other and emitters connected to the power supply Vapd via the resistors R11 and R12, respectively. A collector of the transistor Tr1 is connected to the resistor connection switching circuit RSC and the bases of the transistors Tr1 and Tr2, and a collector of the transistor Tr2 is connected to the ground via a resistor R13 for converting a collector current of the transistor Tr2 of the current mirror circuit CM into a voltage. Moreover, a node of the collector of the transistor Tr2 and the resistor R13 is connected to an input side of the peak detector circuit PDC.

The resistor connection switching circuit RSC is formed as a parallel circuit including the series resistor R14 and a switching element TS formed of, for example, a MOSFET for switching a path, the series resistor R14 and the switching element TS being inserted in series between the collector of the transistor Tr1 of the current mirror circuit CM and a cathode side of the reversely connected avalanche photodiode APD. An anode side of the avalanche photodiode APD is connected to an input side of the preamplifier PA. Further, an output side of the peak detector circuit PDC is connected to an input side of the comparator CO such as, for example, a hysteresis comparator, and an output side of the comparator CO is connected to a terminal of the switching element TS of the resistor connection switching circuit RSC for controlling open and close of the switching element TS. In the case of using a MOSFET, the output side of the comparator CO is connected to a gate terminal of the MOSFET. Note that, the peak detector circuit PDC inputs a reset signal Reset.

Next, the operation is described. Light of an optical signal from the ONU enters the avalanche photodiode APD (hereinafter sometimes simply referred to as "APD"), and then a photocurrent flows through the preamplifier PA. Meanwhile, the current mirror circuit CM of the current detection circuit CD causes a current to flow through the resistor R13 based on values of the resistors R11 and R12. Based on an amount of the flowing current and the values of the resistors, the peak detector circuit PDC holds a peak of an output voltage $V_{R13}$ of the resistor R13.

The comparator CO performs the comparison based on the voltage value measured and held as the peak by the peak detector circuit PDC so as to determine whether the voltage value is less than the predetermined threshold Vth. In a case where the photocurrent flowing through the APD is small and a voltage input to the comparator CO is less than the threshold voltage Vth, the comparator CO outputs a voltage value A (for example, H level) with which the switching element TS of the resistor connection switching circuit RSC enters a "closed" state. On the other hand, in a case where the photocurrent flowing through the APD is large and a voltage input to the comparator CO is equal to or more than the threshold voltage Vth, the comparator CO outputs a voltage value B (for example, L level) with which the switching element TS enters an "open" state.

The threshold Vth is set to a value equal to or larger than the voltage $V_{R13}$ output from the resistor R13 when such an input current that saturates the AGC of the preamplifier PA flows. The switching of the switching element TS is performed depending on this voltage value, to thereby switch the path between a path passing through the series resistor R14 and a path not passing through the series resistor R14. Specifically, in the case where the comparator CO determines that the output voltage of the peak detector circuit PDC is less than the threshold Vth, the comparator CO outputs the switching signal with which the switching element TS of the resistor connection switching circuit RSC enters the "closed" state. Accordingly, a current flows through the switching element TS having an extremely small resistance, and hence no current flows through the series resistor R14, which leads to a state in which the series resistor R14 is not connected to the APD. On the other hand, in the case where the output voltage of the peak detector circuit PDC is equal to or more than the threshold Vth, the comparator CO outputs the switching signal with which the switching element TS enters the "open" state. Accordingly, no current flows through the switching element TS, but a current flows through the series resistor R14 instead, which leads to a state in which the series resistor R14 is connected to the APD.

Moreover, the output of the peak detector circuit PDC drops to 0 V by the reset signal Reset input thereto when a packet is input (the held peak of the output voltage value is reset to 0 V), and hence a current always flows along the path not passing through the series resistor R14 when the packet is input.

Figure 2:
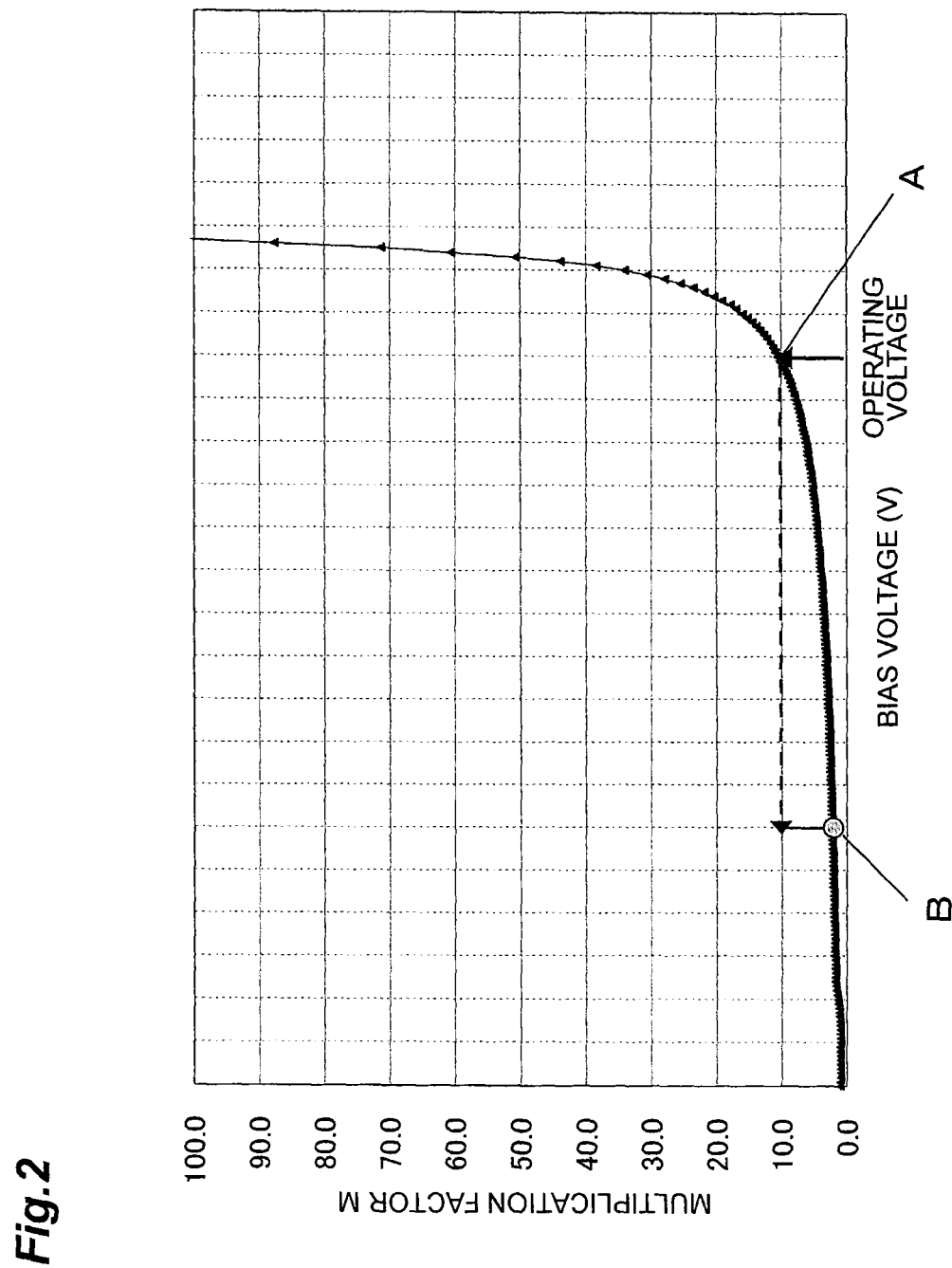
FIG. 2 is a graph showing a state of an APD in a case where a series resistor related to the present invention is connected.

FIG. 2 is a graph showing a state of the APD in a case where the series resistor related to the present invention is connected. FIG. 2 is a graph showing the characteristics of a multiplication factor M of the APD (vertical axis) with respect to a bias voltage of the APD (horizontal axis) in a case where a series resistor of 4 kΩ is connected to the APD. As is apparent from FIG. 2, it is found that, in the case of connecting the series resistor in series, the current value is reduced and the multiplication factor M is also reduced. This is because a photocurrent is generated by the APD so that the voltage drops at the series resistor, and a bias voltage effectively applied to the APD is accordingly reduced, to thereby reduce a flowing current.

In a case where a current of, for example, about 2 mA flows at an operating voltage indicated by the point A of FIG. 2, the voltage drops by 8 V at the series resistor. Due to this voltage drop occurring at the series resistor, as indicated by the point B, the bias voltage applied to the APD is effectively reduced, to thereby reduce the multiplication factor and the photocurrent.

Because the series resistor is connected to the APD in series, there is such a risk that an RC time constant may be increased, and hence the photocurrent of the APD may not respond in burst to a packet changing at high speed. Therefore, in order to connect a resistor in the burst-mode receiver, it is necessary to choose a resistance value not affecting the response. On the other hand, when optical input power is strong in S/N (for example, in a case where input power is larger than −6 dBm), a change in the RC time constant has less influence as shown in FIG. 3.

Figure 3:
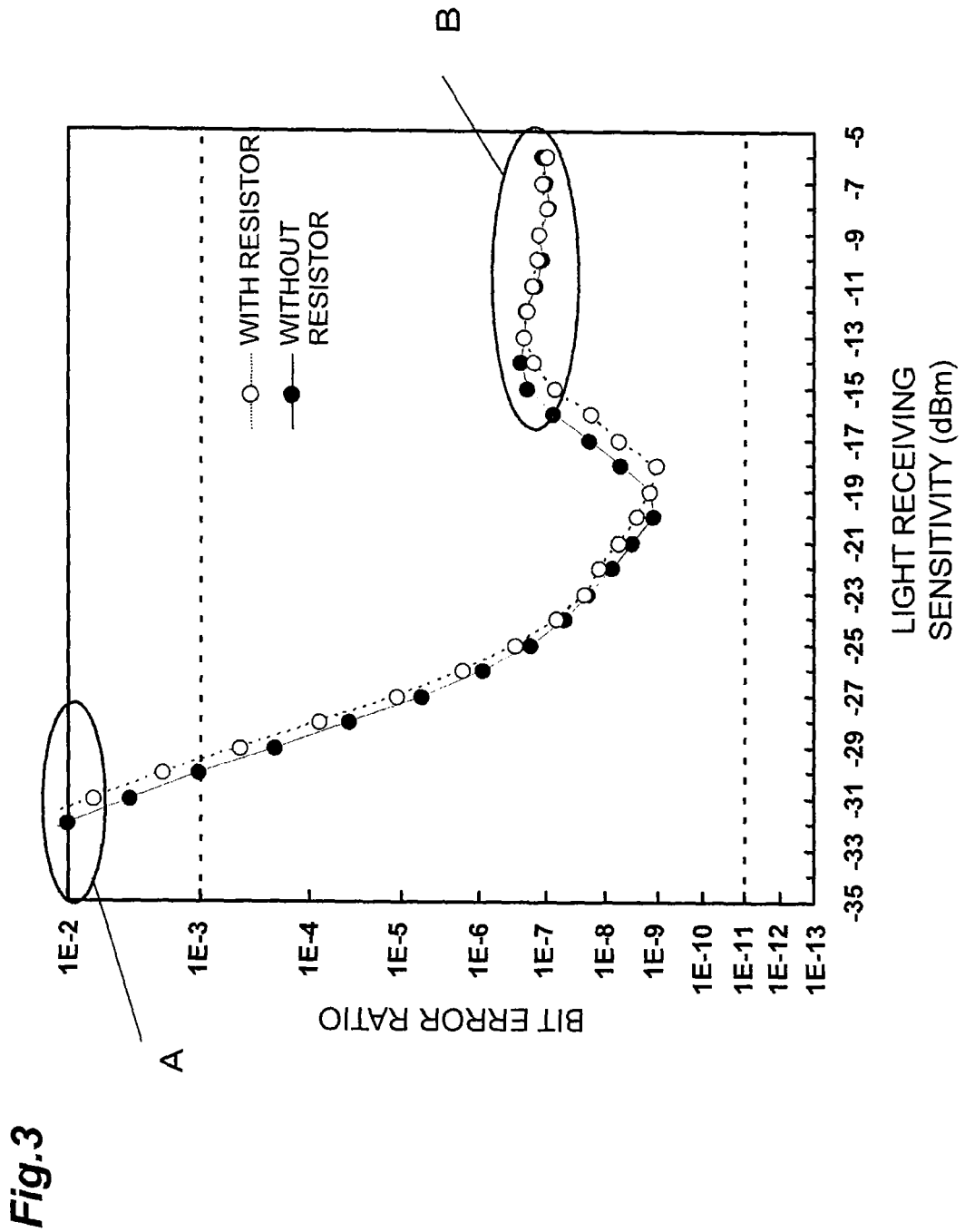
FIG. 3 is a graph showing bit error ratio characteristics in a case where the series resistor related to the present invention is connected.

FIG. 3 is a graph showing bit error ratio characteristics in a case where the series resistor related to the present invention is connected. FIG. 3 is a graph showing the bit error ratio ((BER): vertical axis) characteristics with respect to receiving sensitivity (received optical power (ROP) (dBm): horizontal axis). White circles indicate the case of connecting the series resistor, whereas black circles indicate the case of not connecting the series resistor. At power around the lowest light receiving sensitivity, which is indicated by the region A, the bit error ratio characteristics are degraded due to the influence of the presence of the series resistor. On the contrary, at power around the highest light receiving sensitivity, which is indicated by the region B, high optical input with excellent S/N is made and there is thus no bit error ratio difference between the presence and the absence of the series resistor.

Thus, the series resistor is connected only when strong light input is made so that a photocurrent at the time when high optical input is made can be reduced without affecting the lowest receiving sensitivity. Moreover, an amount of voltage drop by the series resistor is determined depending on a value of the photocurrent, and hence it is possible to realize voltage drop with a constant ratio depending on the amount of current. Consequently, unlike the related-art example, it is not necessary to change a voltage set value depending on product variation among the APDs, and to measure a voltage having a certain multiplication factor M value. Moreover, the circuit can be formed only by the series resistor and the simple switching element, and hence a relatively simple circuit configuration can be realized. Further, the switching element performs the switching, and hence switching at high speed can be realized.

Figure 4:
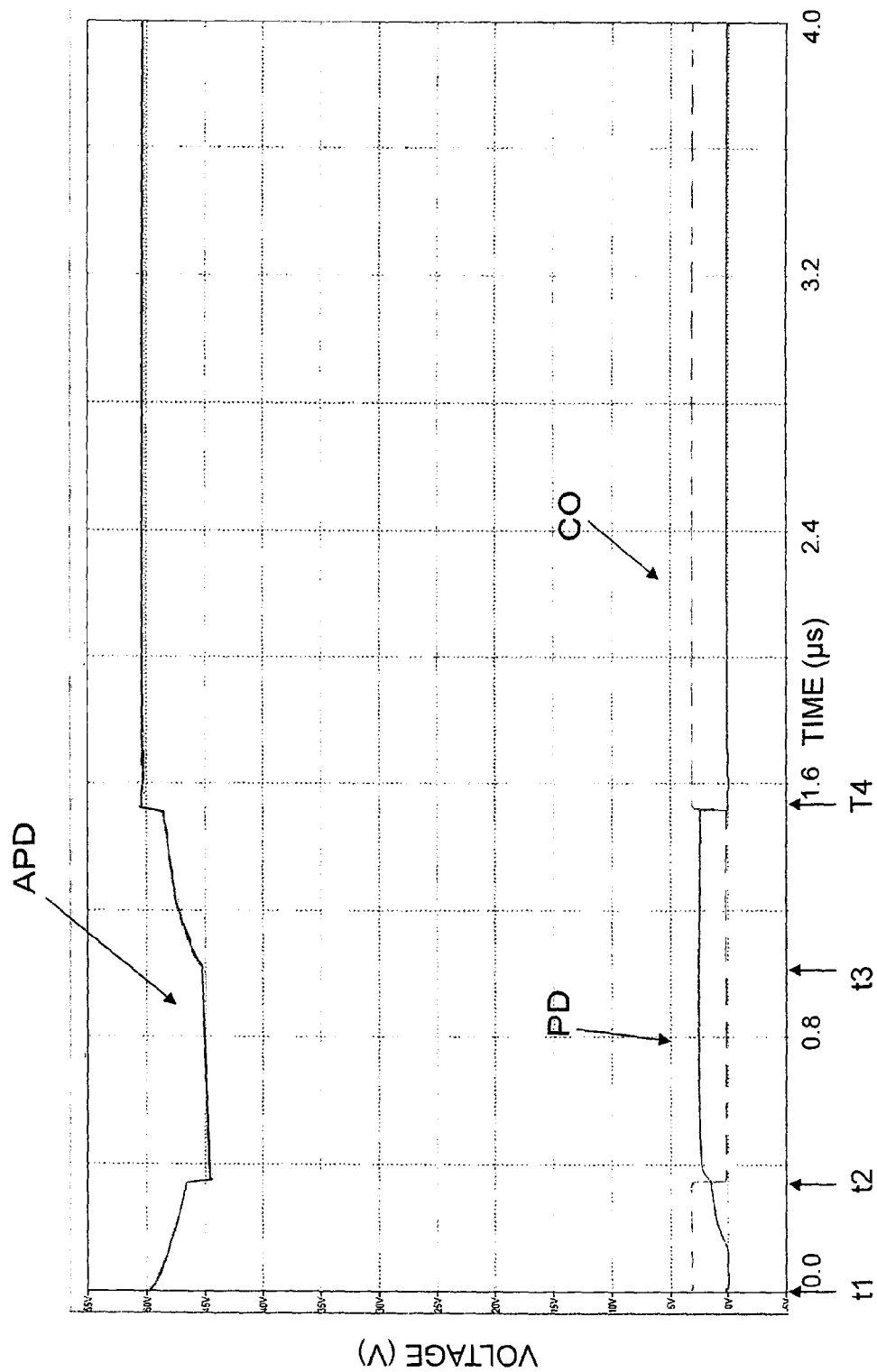
FIG. 4 is a graph showing a result of simulation of an actual change in a voltage of the APD when the circuit configuration of FIG. 1 is applied.
Figure 5:
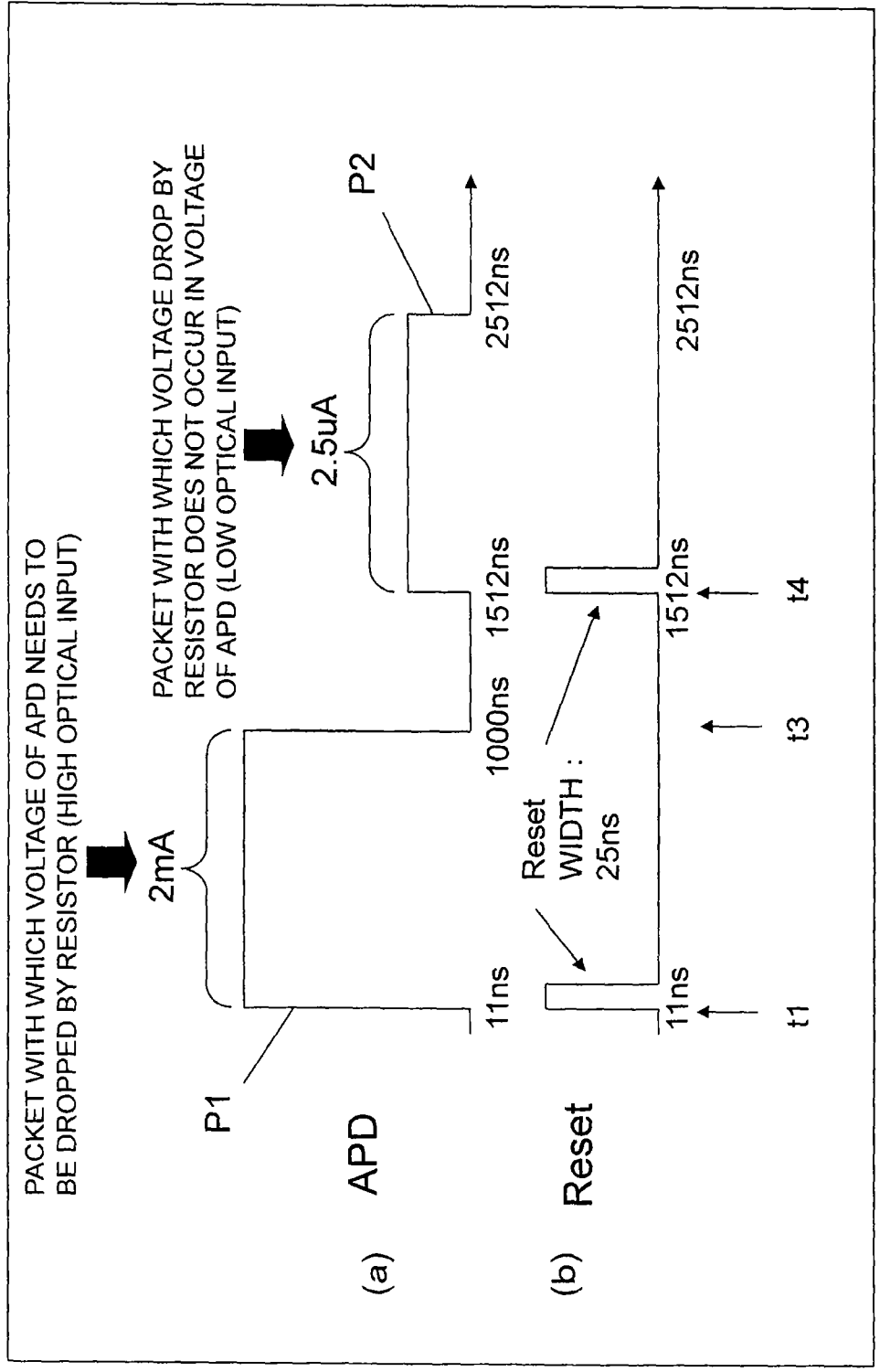
FIG. 5 is a diagram illustrating a packet configuration used in the simulation of FIG. 4.

FIG. 4 shows a result of simulation of an applied voltage change in the APD when the circuit configuration of FIG. 1 is applied, and FIG. 5 illustrates a packet configuration used in the simulation. FIG. 4, in which the horizontal axis represents time and the vertical axis represents a voltage, shows temporal changes in a voltage APD applied to the APD, an output voltage PD of the peak detector circuit PDC, and an output CO of the comparator CO. Moreover, part (a) of FIG. 5 illustrates the photocurrent at the APD, and part (b) of FIG. 5 illustrates a timing of inputting the reset signal Reset to the peak detector circuit PDC.

At a time t1 (11 ns) of FIG. 5, a packet P1 is generated at the APD together with the reset signal Reset, which has a large photocurrent (2 mA: high optical input) generating such a voltage at the APD that needs to be dropped by the series resistor. At a time t1 of FIG. 4, the voltage PD is once set to zero by the reset signal Reset and then is increased. The output CO is changed from an "H" level to an "L" level when the voltage PD becomes equal to or more than the threshold Vth at a time t2, and at the same time, the voltage APD is also reduced due to the connection of the series resistor R14. Then, when the packet P1 is ended at a time t3 (1,000 ns) as illustrated in FIG. 5, the voltage APD of FIG. 4 is gradually increased in accordance with a time constant. Then, at a time t4 (1,512 ns), a packet P2 is generated this time at the APD together with the reset signal Reset, which has a small photocurrent (2.5 µA: low optical input) generating such a voltage at the APD that does not need to drop by the series resistor. The voltage PD is hardly increased and thus does not become equal to or more than the threshold Vth. Accordingly, the output CO maintains the "H" level and the series resistor R14 is not connected.

As is apparent from the result of FIG. 5, at the time of input of the first packet P1 with which it is necessary for the voltage to drop by the series resistor, the voltage drops by the series resistor and the response at high speed of hundreds of ns can be realized. On the other hand, it is found that, at the time of low input, the output CO of the comparator CO becomes the "H" level and the voltage drop by the series resistor does not occur. Moreover, it is found that the reset signal Reset is input to the peak detector circuit PDC when a packet is input, and hence the switching element TS always enters the "closed" state before the current mirror circuit CM outputs a current.

In the present invention, the determination is made based on the peak detection, and hence when an output amplitude once reaches the maximum value, a constant value is continuously output thereafter. Consequently, the variation in the APD current (photocurrent) and the like, which are caused due to redetermination, hardly occur.

Moreover, before a packet is input from an outside, a signal input in synchronization with the input of a packet, such as a reset signal output from a host board side or from inside of the optical receiver, or a rate select signal for switching operating speed, is used as the above-mentioned reset signal Reset for the operation of once returning the output value of the peak detector circuit to zero. Thus, immediately after light is input, the operation of causing a photocurrent to flow is performed always in the state in which the series resistor is not connected. With this operation, when light having low optical input power is input to the optical receiver, the series resistor is connected so that the response speed can be prevented from being reduced.

Moreover, the switching of the threshold at which the resistance value is changed, that is, the series resistor is switched is performed in the saturation region of the AGC of the preamplifier, and hence the output variation of the preamplifier due to the switching of the resistor does not occur.

Note that, the switching element TS of the resistor connection switching circuit RSC is not limited to a MOSFET, and may be other semiconductor switching elements such as a bipolar transistor.

Moreover, the comparator CO may be a hysteresis comparator having thresholds shifted between the "H" and "L" switching directions of the output in order to prevent chattering of the switching element TS. In this case, if a value equal to or more than the voltage $V_{R13}$, which is output from the resistor R13 when the above-mentioned input current saturating the AGC of the preamplifier PA flows, is set to Vth, a threshold Vth1 for switching from "H" to "L" and a threshold Vth2 for switching from "L" to "H" have values shifted to respective sides of the Vth, or one of values of the threshold Vth1 and the threshold Vth2 is the same as that of the Vth and the other thereof is shifted from that of the Vth.

REFERENCE SIGNS LIST

APD: avalanche photodiode, CD: current detection circuit, CM: current mirror circuit, CO: comparator, PA: preamplifier, PDC: peak detector circuit, R11, R12, R13: resistor, R14: series resistor, RSC: resistor connection switching circuit, Tr1, Tr2: transistor, TS: switching element, Vapd: power supply.

The invention claimed is:

1. A burst-mode receiver for receiving burst optical signals having different intensities by a reversely connected APD, the burst-mode receiver comprising:
    a current detection circuit for outputting a photocurrent that is generated by the reversely connected APD and is output from a current mirror circuit as a voltage proportional to the photocurrent, the current mirror circuit being connected in series between a power supply and the reversely connected APD;
    a peak detector circuit for detecting and holding a peak value of the output voltage of the current detection circuit;
    a resistor connection switching circuit, which is inserted between the current mirror circuit and the reversely connected APD, for connecting a series resistor to the reversely connected APD in series by switching; and
    a comparator for outputting a switching signal for switching the resistor connection switching circuit so that the series resistor is connected to the reversely connected APD in series in a case where a voltage detected by the peak detector circuit is equal to or more than a predetermined threshold.

2. The burst-mode receiver according to claim 1, wherein the peak detector circuit resets the held peak value of the output voltage in response to a reset signal input in synchronization with an input of a packet.

3. The burst-mode receiver according to claim 1, wherein the reversely connected APD has a cathode side to which the resistor connection switching circuit is connected and an anode side to which a preamplifier is connected, and
    wherein the predetermined threshold of the comparator has a value equal to or more than the voltage detected by the peak detector circuit when a photocurrent saturating an AGC of the preamplifier flows.

4. The burst-mode receiver according to claim 1, wherein the resistor connection switching circuit comprises a parallel circuit comprising the series resistor and a switching element.

5. The burst-mode receiver according to claim 1, wherein the comparator comprises a hysteresis comparator having thresholds different depending on switching directions of the switching signal.

6. A method of bias voltage control for an APD of a burst-mode receiver for receiving burst optical signals having different intensities by a reversely connected APD, the method comprising:
   detecting a photocurrent that is generated by the reversely connected APD and is output from a current mirror circuit as a voltage proportional to the photocurrent, the current mirror circuit being connected in series between a power supply and the reversely connected APD; and
   switching a resistor connection switching circuit so that a series resistor is connected to the reversely connected APD in series in a case where a value of the detected voltage is equal to or more than a predetermined threshold, the resistor connection switching circuit being inserted between the current mirror circuit and the reversely connected APD for connecting the series resistor to the reversely connected APD in series by switching.

7. The burst-mode receiver according to claim 2, wherein the reversely connected APD has a cathode side to which the resistor connection switching circuit is connected and an anode side to which a preamplifier is connected, and
   wherein the predetermined threshold of the comparator has a value equal to or more than the voltage detected by the peak detector circuit when a photocurrent saturating an AGC of the preamplifier flows.

8. The burst-mode receiver according to claim 2, wherein the resistor connection switching circuit comprises a parallel circuit comprising the series resistor and a switching element.

9. The burst-mode receiver according to claim 3, wherein the resistor connection switching circuit comprises a parallel circuit comprising the series resistor and a switching element.

10. The burst-mode receiver according to claim 7, wherein the resistor connection switching circuit comprises a parallel circuit comprising the series resistor and a switching element.

11. The burst-mode receiver according to claim 2, wherein the comparator comprises a hysteresis comparator having thresholds different depending on switching directions of the switching signal.

12. The burst-mode receiver according to claim 3, wherein the comparator comprises a hysteresis comparator having thresholds different depending on switching directions of the switching signal.

13. The burst-mode receiver according to claim 4, wherein the comparator comprises a hysteresis comparator having thresholds different depending on switching directions of the switching signal.

14. The burst-mode receiver according to claim 7, wherein the comparator comprises a hysteresis comparator having thresholds different depending on switching directions of the switching signal.

15. The burst-mode receiver according to claim 8, wherein the comparator comprises a hysteresis comparator having thresholds different depending on switching directions of the switching signal.

16. The burst-mode receiver according to claim 9, wherein the comparator comprises a hysteresis comparator having thresholds different depending on switching directions of the switching signal.

17. The burst-mode receiver according to claim 10, wherein the comparator comprises a hysteresis comparator having thresholds different depending on switching directions of the switching signal.

* * * * *